United States Patent

Saile et al.

[11] Patent Number: 5,843,838
[45] Date of Patent: *Dec. 1, 1998

[54] MODIFIED CLEAN RECIPE TO SUPPRESS FORMATION OF BPSG BUBBLE

[75] Inventors: George O. Saile, Poughkeepsie, N.Y.; Han-Chung Chen, Hsin-Chu-Hsien, Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 921,093

[22] Filed: Aug. 29, 1997

Related U.S. Application Data

[63] Continuation of Ser. No. 578,930, Dec. 27, 1995.

[51] Int. Cl.⁶ .................................................. H01L 21/316
[52] U.S. Cl. ...................... 438/632; 438/760; 438/784; 438/905; 134/1.1
[58] Field of Search ...................................... 438/632, 760, 438/784, 905; 134/1.1, 1.2, 1, 2, 22.1, 27

[56] References Cited

U.S. PATENT DOCUMENTS

| | | | |
|---|---|---|---|
| 5,041,311 | 8/1991 | Tsukune et al. | 427/255.3 |
| 5,071,788 | 12/1991 | Joshi | 437/192 |
| 5,129,958 | 7/1992 | Nagashima et al. | 134/22.1 |
| 5,207,836 | 5/1993 | Chang | 134/1 |
| 5,260,236 | 11/1993 | Petro et al. | 438/905 |
| 5,270,256 | 12/1993 | Bost et al. | 437/195 |
| 5,326,723 | 7/1994 | Petro et al. | 438/905 |
| 5,434,096 | 7/1995 | Chu et al. | 437/44 |
| 5,632,821 | 5/1997 | Doi | 134/1.1 |
| 5,647,953 | 7/1997 | Williams et al. | 134/1.1 |

FOREIGN PATENT DOCUMENTS

| | | |
|---|---|---|
| 05-029285 | 2/1993 | Japan . |
| 05-259083 | 10/1993 | Japan . |

OTHER PUBLICATIONS

Wolf, Stanley, *Silicon Processing For The VLSI Era*, vol. 2, pp. 104–105 and 194–195 (1990).

*Primary Examiner*—Charles Bowers
*Assistant Examiner*—Matthew Whipple
*Attorney, Agent, or Firm*—George O. Saile; Stephen B. Ackerman; Rosemary L. S. Pike

[57] ABSTRACT

A method of forming a BPSG dielectric layer on a wafer without delamination in the fabrication of an integrated circuit device wherein a BPSG deposition chamber is used is described. Semiconductor device structures are provided in and on a semiconductor substrate. The BPSG deposition chamber is cleaned according to the following steps. The deposition chamber is cleaned using a fluorine-containing gas. The fluorine-containing gas is pumped out of the deposition chamber wherein residual fluorine-containing gas remains within the deposition chamber. A plasma is flowed into the deposition chamber wherein the plasma consumes all of the residual fluorine-containing gas. The plasma is purged from the deposition chamber to complete the cleaning of the BPSG deposition chamber. Thereafter, a layer of BPSG is deposited over the semiconductor device structures wherein the BPSG layer is deposited while the wafer is within the BPSG deposition chamber. The BPSG layer is flowed wherein no fluorine gas bubble is formed within the BPSG layer to complete the formation of the BPSG dielectric layer on the wafer without delamination in the fabrication of an integrated circuit device.

12 Claims, 2 Drawing Sheets

MODIFIED CLEAN RECIPE TO SUPPRESS FORMATION OF BPSG BUBBLE

This application is a continuation of Ser. No. 08/578,930 filed Dec. 27, 1995.

BACKGROUND OF THE INVENTION (1) Field of the Invention

The present invention relates to the fabrication of integrated circuit devices, and more particularly, to a method of preventing the formation of a bubble at the polycide-BPSG interface after BPSG flow in the fabrication of an integrated circuit.

(2) Description of the Prior Art

In the fabrication of polycide gates, it is well known in the art to use tungsten hexafluoride ($WF_6$) gas to form a tungsten silicide layer on a polysilicon gate. In the conventional process, a layer of undoped silicate glass (USG) and borophosphosilicate glass (BPSG) is deposited over the polycide gate and then flowed. FIG. 1 illustrates a partially completed integrated circuit device in which a tungsten silicide layer 18 has been formed on a polysilicon gate 16. The USG-BPSG layer 26 has been deposited and flowed. It has been observed that a bubble 28 appears at the interface of the polycide layer and the USG/BPSG film after the BPSG flow process. The cause of the bubble, and resulting delamination, appears to be fluorine outgassing from the tungsten silicide film which extrudes a BPSG bubble during the BPSG flow process. The fluorine is accumulated from the tungsten silicide process and from implantation.

U.S. Pat. No. 5,434,096 to Chu et al teaches annealing and degassing after the tungsten silicide process and implantation, before the BPSG process. This removes most of the accumulated fluorine. However, even after using this process, BPSG bubbles appeared on some wafers. It has been found that fluorine introduced during the BPSG deposition chamber cleaning process can cause the BPSG bubble in wafers entering the deposition chamber after cleaning.

U.S. Pat. No. 5,071,788 to Joshi teaches annealing in a forming gas or pure $H_2$ gas at below 900° C. to reduce the number of fluorine and oxygen ions in the film.

U.S. Pat. No. 5,270 256 to Bost et al discloses a guard ring to prevent BPSG delamination.

SUMMARY OF THE INVENTION

Accordingly, it is a primary object of the present invention to provide a modified BPSG deposition chamber cleaning process which prevents delamination after BPSG flow.

A method of forming a BPSG dielectric layer on a wafer without delamination in the fabrication of an integrated circuit device wherein a BPSG deposition chamber is used is achieved. Semiconductor device structures are provided in and on a semiconductor substrate. The BPSG deposition chamber is cleaned according to the following steps. The deposition chamber is cleaned using a fluorine-containing gas. The fluorine-containing gas is pumped out of the deposition chamber wherein residual fluorine-containing gas remains within the deposition chamber. A plasma is flowed into the deposition chamber wherein the plasma consumes all of the residual fluorine-containing gas. The plasma is purged from the deposition chamber to complete the cleaning of the BPSG deposition chamber. Thereafter, a layer of BPSG is deposited over the semiconductor device structures wherein the BPSG layer is deposited while the wafer is within the BPSG deposition chamber. The BPSG layer is flowed wherein no fluorine gas bubble is formed within the BPSG layer to complete the formation of the BPSG dielectric layer on the wafer without delamination in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

After deposition of BPSG onto a wafer, the deposition chamber is cleaned after the wafer is removed to remove the BPSG film deposited on the chamber walls. The reaction gas of the clean recipe is $N_2O$, $C_2F_6$ or $N_2O$, $CF_4$ depending on the type of susceptor. If the residual $C_2F_6$ or $CF_4$ gas is not erased completely by chamber pumping, $C_2F_6$ or $CF_4$ will play an important role in the formation of the BPSG bubble. Residual $C_2F_6$ or $CF_4$ can be absorbed by the next wafer entering the BPSG deposition chamber and increase the total fluorine content of the wafer. The oversaturated fluorine will form a fluorine bubble whose high pressure will delaminate the BPSG film after BPSG flow.

The process of the present invention is a modified BPSG deposition chamber cleaning recipe to remove the residual fluorine-containing gas, such as $C_2F_6$ or $CF_4$ gas. $SiH_4$ plasma or $SiH_4$, $N_2O$ plasma is added to the cleaning recipe. The $SiH_4$ plasma or $SiH_4$, $N_2O$ plasma can consume the residual fluorine-containing gas coming from the chamber cleaning process, and thus, reduce the possibility of forming a BPSG bubble. It has been found that $SiH_4$ flow or $N_2O$ plasma do not consume the residual fluorine-containing gas.

Figure 1:
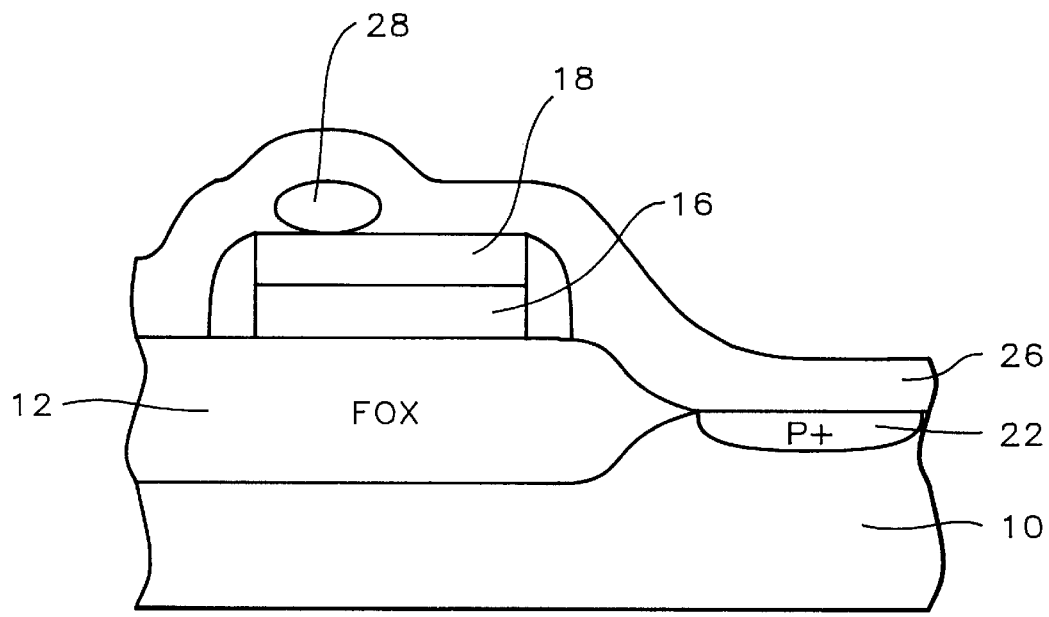
FIG. 1 is a cross-sectional representation of the delamination problem of the prior art.
Figure 2:
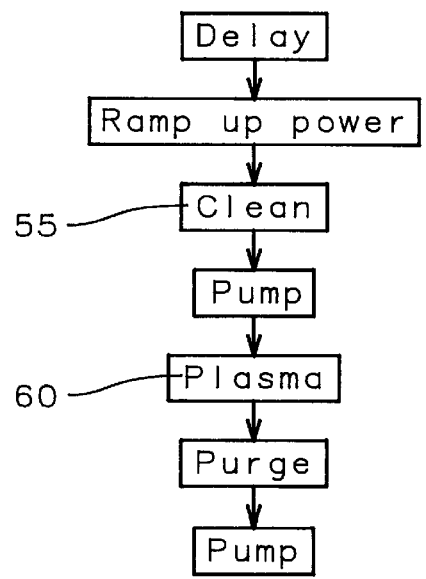
FIG. 2 is a flow chart of the modified BPSG deposition chamber cleaning process of the present invention.

FIG. 2 is a flow chart of the modified cleaning process of the present invention. Step 60 is the added $SiH_4$ or $SiH_4$, $N_2O$ plasma process of the invention which removes the residual fluorine-containing gas resulting from the cleaning step 55. During the plasma step, $SiH_4$ plasma is flowed at a rate of between about 20 to 100 sccm at a power of between about 150 to 400 watts for a duration of between about 5 to 30 seconds. Alternatively, $SiH_4$ and $N_2O$ plasmas are flowed at the rate of between about 20 to 100 sccm and between about 500 to 1500 sccm, respectively, at a power of between about 150 to 400 watts for a duration of between about 5 to 30 seconds.

Figure 3:
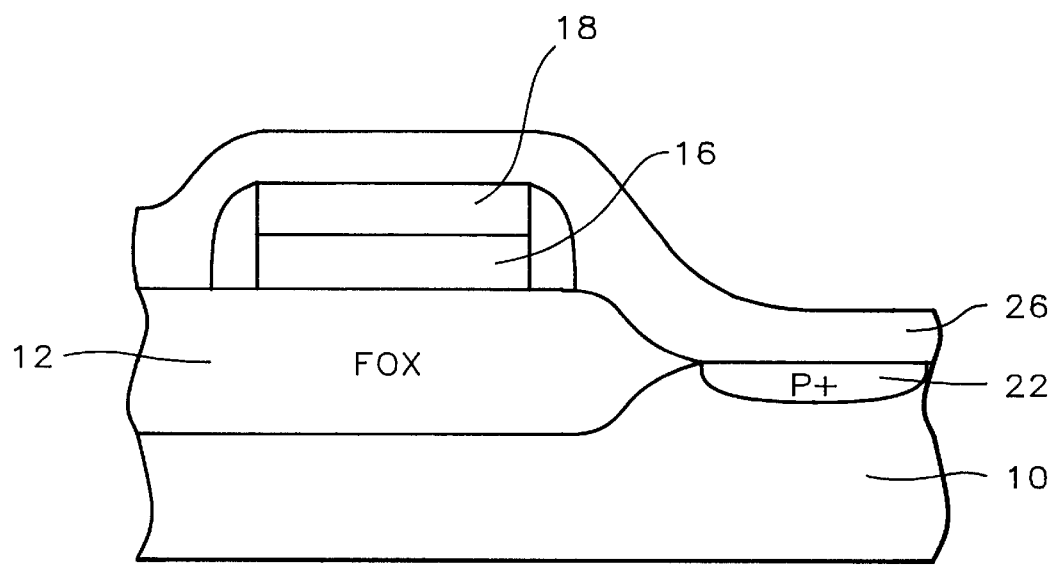
FIG. 3 is a cross-sectional representation of the an integrated circuit device fabricated using the process of the present invention.

FIG. 3 illustrates a partially completed integrated circuit device of the present invention. Field oxide region 12 has been formed in and on semiconductor substrate 10. Tungsten silicide layer 18 has been formed on polysilicon gate 16. A dielectric layer 26, composed of borophosphosilicate glass (BPSG) or borophospho-tetraethoxysilane (BPTEOS) with an underlayer of undoped silicate glass (USG) is blanket deposited over the surface of the substrate to a preferred thickness of between about 3000 to 11,000 Angstroms, as shown in FIG. 3. The BPSG layer 26 is flowed at between about 800° to 1000° C. Because of the reduction of the fluorine concentration brought about by the modified deposition chamber cleaning recipe, no bubble is formed at the polycide-USG/BPSG interface.

The process of the invention has been found to be effective experimentally. When SiH$_4$ or SiH$_4$, N$_2$O plasma is added to the BPSG deposition chamber cleaning process, no bubble is formed. When the plasma step is removed from the cleaning process, a bubble is formed.

While the invention has been particularly shown and described with reference to the preferred embodiments thereof, it will be understood by those skilled in the art that various changes in form and details may be made without departing from the spirit and scope of the invention.

What is claimed is:

1. A method of cleaning a BPSG deposition chamber comprising:

initially cleaning said deposition chamber using a fluorine-containing gas;

pumping said fluorine-containing gas out of said deposition chamber wherein residual fluorine-containing gas remains within said deposition chamber;

thereafter, flowing only a SiH$_4$ plasma and a N$_2$O plasma into said deposition chamber wherein said plasma consumes all of said residual fluorine-containing gas; and purging said plasma from said deposition chamber to complete said cleaning of said BPSG deposition chamber.

2. The method according to claim 1 wherein said SiH$_4$ plasma is flowed at the rate of between about 20 to 100 sccm and wherein said N$_2$O plasma is flowed at the rate of between about 500 to 1500 sccm at a power of between about 150 to 400 watts for between about 5 to 30 seconds.

3. The method according to claim 1 wherein said removing of said residual fluorine-containing gas results in the prevention of a BPSG bubble formed after reflow of a BPSG layer when said BPSG layer is deposited after said initially cleaning of said BPSG deposition chamber.

4. A method of forming a BPSG dielectric layer on a wafer without delamination in the fabrication of an integrated circuit device wherein a BPSG deposition chamber is used comprising:

providing semiconductor device structures in and on a semiconductor substrate;

cleaning said BPSG deposition chamber to remove residual fluorine-containing gas wherein said cleaning comprises flowing only SiH$_4$ plasma and N$_2$O plasma into said chamber;

thereafter depositing a layer of BPSG over said semiconductor device structures wherein said BPSG layer is deposited while said wafer is within said BPSG deposition chamber; and flowing said BPSG layer wherein no fluorine gas bubble is formed within said BPSG layer to complete the formation of said BPSG dielectric layer on said wafer without delamination in the fabrication of said integrated circuit device.

5. The method according to claim 4 wherein said cleaning of said BPSG deposition chamber comprises the steps of:

initially cleaning said deposition chamber using a fluorine-containing gas;

pumping said fluorine-containing gas out of said deposition chamber wherein residual fluorine-containing gas remains within said deposition chamber;

thereafter flowing said plasma into said deposition chamber wherein said plasma consumes all of said residual fluorine-containing gas; and purging said plasma from said deposition chamber to complete said cleaning of said BPSG deposition chamber.

6. The method according to claim 5 wherein said SiH$_4$ plasma is flowed at the rate of between about 20 to 100 sccm and wherein said N$_2$O plasma is flowed at the rate of between about 500 to 1500 sccm at a power of between about 150 to 400 watts for between about 5 to 30 seconds.

7. The method according to claim 5 wherein said BPSG layer is deposited to a thickness of between about 3000 to 10,000 Angstroms.

8. The method according to claim 5 wherein said BPSG layer is flowed at between about 800° to 1000° C.

9. A method of forming a BPSG dielectric layer on a wafer without delamination in the fabrication of an integrated circuit device wherein a BPSG deposition chamber is used comprising:

providing semiconductor device structures in and on a semiconductor substrate;

initially cleaning said deposition chamber using a fluorine-containing gas;

thereafter cleaning said BPSG deposition chamber to remove residual fluorine-containing gas wherein said cleaning comprises the steps of:

pumping said fluorine-containing gas out of said deposition chamber wherein residual fluorine-containing gas remains within said deposition chamber;

thereafter flowing only a SiH$_4$ plasma and a N$_2$O into said deposition chamber wherein said plasma consumes all of said residual fluorine-containing gas; and purging said plasma from said deposition chamber to complete said cleaning of said chamber;

thereafter depositing a layer of BPSG over said semiconductor device structures wherein said BPSG layer is deposited while said wafer is within said BPSG deposition chamber; and flowing said BPSG layer wherein no fluorine gas bubble is formed within said BPSG layer to complete the formation of said BPSG dielectric layer on said wafer without delamination in the fabrication of said integrated circuit device.

10. The method according to claim 9 wherein said SiH$_4$ plasma is flowed at the rate of between about 20 to 100 sccm and wherein said N$_2$O plasma is flowed at the rate of between about 500 to 1500 sccm at a power of between about 150 to 400 watts for between about 5 to 30 seconds.

11. The method according to claim 9 wherein said BPSG layer is deposited to a thickness of between about 3000 to 10,000 Angstroms.

12. The method according to claim 9 wherein said BPSG layer is flowed at between about 800° to 1000° C.

* * * * *

UNITED STATES PATENT AND TRADEMARK OFFICE
CERTIFICATE OF CORRECTION

PATENT NO. : 5,843,838
DATED : December 1, 1998
INVENTOR(S) : Han-Chung Chen

It is certified that error appears in the above-identified patent and that said Letters Patent is hereby corrected as shown below:

Title page, item [19], "Saile et al" should be --Chen-- and item [75], delete "George O. Saile, Poughkeepsie, N.Y.;"

Signed and Sealed this

Ninth Day of March, 1999

Attest:

Q. TODD DICKINSON

Attesting Officer

Acting Commissioner of Patents and Trademarks